(12) United States Patent  
McConnelee et al.

(10) Patent No.: US 9,236,348 B2  
(45) Date of Patent: Jan. 12, 2016

(54) ULTRATHIN BURIED DIE MODULE AND METHOD OF MANUFACTURING THEREOF

(71) Applicant: General Electric Company, Schenectady, NY (US)

(72) Inventors: Paul Alan McConnelee, Albany, NY (US); Scott Smith, Niskayuna, NY (US); Elizabeth Ann Burke, Mechanicville, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 14/188,093

(22) Filed: Feb. 24, 2014

(65) Prior Publication Data

US 2014/0183750 A1     Jul. 3, 2014

Related U.S. Application Data

(63) Continuation of application No. 13/431,168, filed on Mar. 27, 2012, now Pat. No. 8,658,473.

(51) Int. Cl.
*H01L 23/12* (2006.01)
*H01L 21/00* (2006.01)
(Continued)

(52) U.S. Cl.
CPC .......... *H01L 23/5383* (2013.01); *H01L 21/561* (2013.01); *H01L 23/3114* (2013.01); *H01L 23/481* (2013.01); *H01L 23/5226* (2013.01); *H01L 23/5384* (2013.01); *H01L 23/5386* (2013.01); *H01L 23/5387* (2013.01); *H01L 23/5389* (2013.01); *H01L 24/19* (2013.01); *H01L 24/24* (2013.01); *H05K 1/185* (2013.01);
(Continued)

(58) Field of Classification Search
CPC ............ H01L 23/5383; H01L 23/5389; H01L 21/561; H01L 23/3114; H01L 24/19; H01L 24/24; H01L 23/5387; H01L 2224/92244; H01L 25/105; H01L 23/481; H01L 23/5226; H01L 23/5384; H01L 24/25; H01L 23/5386; H05K 1/185; H05K 1/189; H05K 3/4644
See application file for complete search history.

(56) References Cited

U.S. PATENT DOCUMENTS 5,353,498 A   10/1994   Fillion et al.
5,567,657 A   10/1996   Wojnarowski et al.
(Continued)

FOREIGN PATENT DOCUMENTS

EP   1367645 A2   12/2003
EP   1763295 A2   3/2007
(Continued)

*Primary Examiner* — Alonzo Chambliss
(74) *Attorney, Agent, or Firm* — Ziolkowski Patent Solutions Group, SC; Jean K. Testa

(57) ABSTRACT

A method of forming a buried die module includes providing an initial laminate flex layer and forming a die opening through the initial laminate flex layer. A first uncut laminate flex layer is secured to the first surface of the initial laminate flex layer by way of an adhesive material and a die is positioned within the die opening of the initial laminate flex layer and onto the adhesive material. A second uncut laminate flex layer is secured to the second surface of the initial laminate flex layer by way of an adhesive material and the adhesive materials are then cured. Vias and metal interconnects are formed in and on the first and second uncut laminate flex layers, with each of the metal interconnects extending through a respective via and being directly metalized to a metal interconnect on the initial laminate flex layer or a die pad on the die.

19 Claims, 7 Drawing Sheets

(51) Int. Cl.
  *H05K 1/00* (2006.01)
  *H01L 23/538* (2006.01)
  *H01L 21/56* (2006.01)
  *H01L 23/31* (2006.01)
  *H01L 23/00* (2006.01)
  *H05K 1/18* (2006.01)
  *H01L 23/522* (2006.01)
  *H01L 23/48* (2006.01)
  *H01L 21/48* (2006.01)
  *H05K 3/46* (2006.01)
  *H01L 25/10* (2006.01)
  *H01L 21/60* (2006.01)

(52) U.S. Cl.
  CPC ............ *H01L 21/4857* (2013.01); *H01L 24/25* (2013.01); *H01L 25/105* (2013.01); *H01L 2021/60* (2013.01); *H01L 2224/04105* (2013.01); *H01L 2224/24227* (2013.01); *H01L 2224/32225* (2013.01); *H01L 2224/73267* (2013.01); *H01L 2224/92144* (2013.01); *H01L 2224/92244* (2013.01); *H01L 2225/1035* (2013.01); *H01L 2225/1058* (2013.01); *H01L 2924/10253* (2013.01); *H01L 2924/10329* (2013.01); *H01L 2924/14* (2013.01); *H01L 2924/15311* (2013.01); *H01L 2924/15313* (2013.01); *H05K 1/189* (2013.01); *H05K 3/4644* (2013.01)

(56) References Cited

U.S. PATENT DOCUMENTS

| | | | |
|---|---|---|---|
| 5,703,400 A | | 12/1997 | Wojnarowski et al. |
| 6,159,767 A | | 12/2000 | Eichelberger |
| 6,528,348 B2 | | 3/2003 | Ando et al. |
| 7,122,403 B2 | | 10/2006 | Chandran et al. |
| 7,282,390 B2 | | 10/2007 | Tan et al. |
| 7,457,129 B2 | * | 11/2008 | Ikezawa et al. ............... 361/735 |
| 7,485,569 B2 | | 2/2009 | Ryu et al. |
| 7,839,649 B2 | | 11/2010 | Hsu |
| 8,008,125 B2 | | 8/2011 | McConnelee et al. |
| 8,114,708 B2 | | 2/2012 | McConnelee et al. |
| 8,304,913 B2 | | 11/2012 | Nalla et al. |
| 8,384,227 B2 | | 2/2013 | Cho et al. |
| 8,533,941 B2 | | 9/2013 | Eichelberger et al. |
| 8,578,598 B2 | * | 11/2013 | Chen et al. ..................... 29/831 |
| 8,658,473 B2 | * | 2/2014 | McConnelee et al. ........ 438/125 |
| 2002/0020898 A1 | | 2/2002 | Vu et al. |
| 2005/0047094 A1 | | 3/2005 | Hsu et al. |
| 2006/0043573 A1 | | 3/2006 | Hedler et al. |
| 2006/0191711 A1 | | 8/2006 | Cho et al. |
| 2006/0202331 A1 | | 9/2006 | Hu |
| 2008/0318413 A1 | | 12/2008 | Fillion et al. |
| 2009/0039491 A1 | | 2/2009 | Kim et al. |
| 2009/0166832 A1 | * | 7/2009 | Dunne ................ H01L 23/5389 257/680 |
| 2009/0309212 A1 | * | 12/2009 | Shim ..................... H01L 21/568 257/700 |
| 2010/0224992 A1 | | 9/2010 | McConnelee et al. |
| 2011/0316767 A1 | | 12/2011 | Avrahami |
| 2012/0018882 A1 | * | 1/2012 | Shim ..................... H01L 21/568 257/737 |

FOREIGN PATENT DOCUMENTS

| | | |
|---|---|---|
| JP | 11045955 A | 2/1999 |
| JP | 2002246536 A | 8/2002 |
| JP | 2002246745 A | 8/2002 |
| JP | 2003234432 A | 8/2003 |
| JP | 2005317903 A | 11/2005 |
| WO | 2009009436 A2 | 1/2009 |

\* cited by examiner

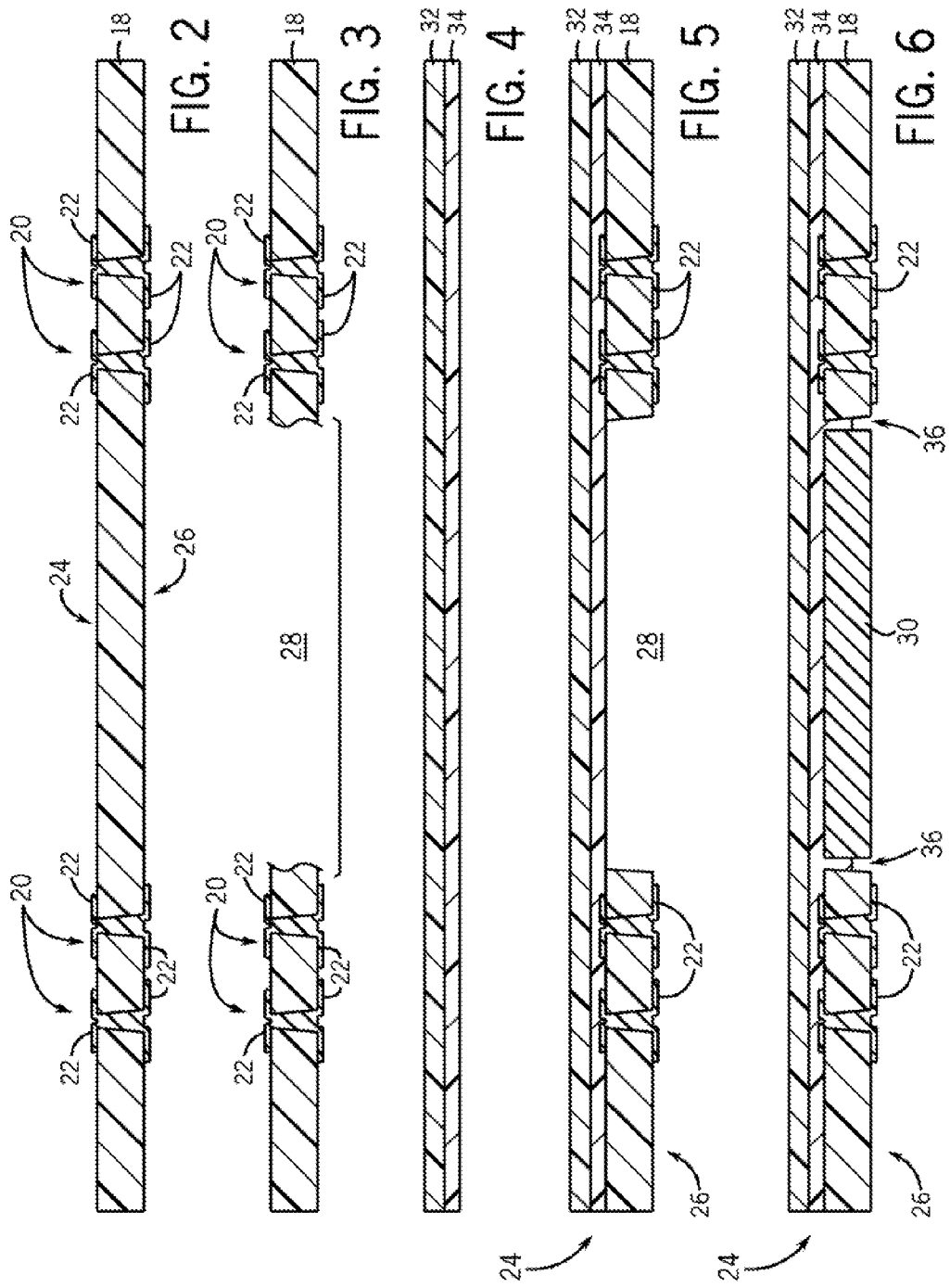

ULTRATHIN BURIED DIE MODULE AND METHOD OF MANUFACTURING THEREOF

CROSS-REFERENCE TO RELATED APPLICATION

The present application is a continuation of, and claims priority to, U.S. patent application Ser. No. 13/431,168, filed Mar. 27, 2012, the disclosure of which is incorporated herein by reference.

BACKGROUND OF THE INVENTION

Embodiments of the invention relate generally to integrated circuit packages and, more particularly, to a buried die build-up that uses low resistance metal interconnects directly to the chip bond pad or electrical component connection pad, allowing higher device speeds, lower power consumption, and smaller size. Buried die modules can be manufactured having one or more dies or electronic components in. The plurality of dies or electronic components are electrically connected to an input/output system by way of metal interconnects routed through a plurality of laminate flex layers.

As integrated circuits become increasingly smaller and yield better operating performance, packaging technology for integrated circuit (IC) packaging has correspondingly evolved from leaded packaging, to laminated-based ball grid array (BGA) packaging, to chip scale packaging (CSP), then flipchip packages, and now buried die/embedded chip build-up packaging. Advancements in IC chip packaging technology are driven by ever-increasing needs for achieving better performance, greater miniaturization, and higher reliability. New packaging technology has to further provide for the possibilities of batch production for the purpose of large-scale manufacturing thereby allowing economy of scale.

Advancements in IC chip packaging requirements pose challenges to the existing buried die build-up process. That is, it is desired in many current buried die modules to have an increased number of re-distribution layers, with eight or more re-distribution layers being common. The standard buried die build-up process, in which the one or more dies are initially placed on the IC substrate and the re-distribution layers are subsequently applied in a layer-by-layer fashion, can lead to warpage in the rerouting and interconnection system, requiring the use of a molded epoxy stress balance layer or metal stiffener.

Another challenge to the existing buried die build-up process is the time of the manufacturing/build-up cycle. A major contributor to the build-up time is the multiple curing steps that are performed for curing the plurality of adhesive layers included in the buried die module, such as multiple baking steps.

Accordingly there is a need for a method for buried die fabrication that provides a shorter manufacturing cycle time and allows for the application of multiple laminate layers while minimizing warpage of the module without the use of a stiffener.

BRIEF DESCRIPTION OF THE INVENTION

Embodiments of the invention overcome the aforementioned drawbacks by providing a buried die module build-up process in which a plurality of laminate flex layers are applied about a die in a double-sided fashion that provides for construction of a completely balanced module. A single curing step is performed to cure multiple adhesive layers in the module, thereby reducing the build-up time.

In accordance with one aspect of the invention, a method of forming a buried die module includes providing an initial laminate flex layer and forming a plurality of vias and a plurality of metal interconnects in and on the initial laminate flex layer, the plurality of metal interconnects extending through respective vias so as to form interconnects on each of opposing first and second surfaces of the initial laminate flex layer, forming a die opening through the initial laminate flex layer. The method also includes securing a first uncut laminate flex layer to the first surface of the initial laminate flex layer by way of an adhesive material, positioning a die within the die opening of the initial laminate flex layer and onto the adhesive material, securing a second uncut laminate flex layer to the second surface of the initial laminate flex layer by way of an adhesive material, curing the adhesive material between the first uncut laminate flex layer and the initial laminate flex layer and between the second uncut laminate flex layer and the initial laminate flex layer, and forming a plurality of vias and a plurality of metal interconnects in and on the first and second uncut laminate flex layers, each of the plurality of metal interconnects extending through a respective via and being directly metalized to one of a metal interconnect on the initial laminate flex layer and a die pad on the die.

In accordance with another aspect of the invention, a method of forming an embedded chip package includes forming a plurality of vias in a center laminate layer, forming a plurality of metal interconnects that extend through the plurality of vias so as to form interconnects on each of opposing first and second surfaces of the center laminate layer, forming a chip opening through the center laminate layer, applying a first uncut laminate layer to the first surface of the center laminate layer by way of an adhesive material, and positioning a chip within the chip opening of the center laminate layer and onto the adhesive material, the chip having a thickness equal to a thickness of the center laminate layer. The method also includes applying a second uncut laminate layer to the second surface of the center laminate layer by way of an adhesive material, curing the adhesive material between the first uncut laminate layer and the center laminate layer and between the second uncut laminate layer and the center laminate layer, and patterning the first and second uncut laminate layers to form a plurality of vias and a plurality of metal interconnects such that each of the plurality of metal interconnects extends through a respective via and is directly metalized to one of a metal interconnect on the center laminate layer and a chip pad on the chip.

In accordance with yet another aspect of the invention, an embedded chip package is manufactured by a process that includes the step of pre-patterning a center laminate layer to form a plurality of vias and a plurality of metal interconnects that extend through the plurality of vias, wherein the plurality of metal interconnects form interconnects on each of opposing first and second surfaces of the center laminate layer. The process also includes forming a die opening through the center laminate layer, applying a first uncut laminate layer to the first surface of the center laminate layer by way of an adhesive material, positioning a die within the die opening of the center laminate layer and onto the adhesive material, the die having a thickness equal to a thickness of the center laminate layer, applying a second uncut laminate layer to the second surface of the center laminate layer by way of an adhesive material, curing the adhesive material between the first uncut laminate flex layer and the base laminate flex layer and between the second uncut laminate flex layer and the base laminate flex layer together at the same time, and performing a double-sided patterning the first and second uncut laminate flex layers to form a plurality of vias and a plurality of metal interconnects, wherein the plurality of vias and the plurality of metal interconnects of the first uncut laminate flex layer are formed from a first direction and the plurality of vias and the plurality of metal interconnects of the second uncut laminate flex layer are formed from a second direction that is opposite the first direction.

These and other advantages and features will be more readily understood from the following detailed description of preferred embodiments of the invention that is provided in connection with the accompanying drawings.

BRIEF DESCRIPTION OF THE DRAWINGS

The drawings illustrate embodiments presently contemplated for carrying out the invention.

In the drawings:

FIGS. 2-10 are schematic cross-sectional side views of a buried die module during various stages of a manufacturing/build-up process according to an embodiment of the invention.

DETAILED DESCRIPTION OF THE PREFERRED EMBODIMENTS

The present invention provides for a method of forming a buried die module (i.e., embedded chip package). The buried die module is manufactured using laminate flex layers and placement of chips or electrical components relative to the laminate layers. The die/electrical component(s) in the buried die module is connected to an input/output (I/O) system by way of a direct metallic connection provided by metal interconnects formed in the patterned laminate layers.

Embodiments of the invention are directed to build-up of a buried die module that includes one or more dies (i.e., chips) embedded within a plurality of patterned laminate flex layers (i.e., re-distribution layers). While the chip embedded in the buried die module is referenced below in the embodiments of FIGS. 1-12 specifically as a die or chip, it is understood that other electrical components could be substituted in the buried die module for the die, and thus embodiments of the invention are not limited only to the embedding of chips/dies in a buried die module. That is, the use of dies/chips in the buried die module embodiments described below should also be understood to encompass other electrical components such as resistors, capacitors, inductors, or other similar devices, that could be provided in the buried die module.

Figure 1:
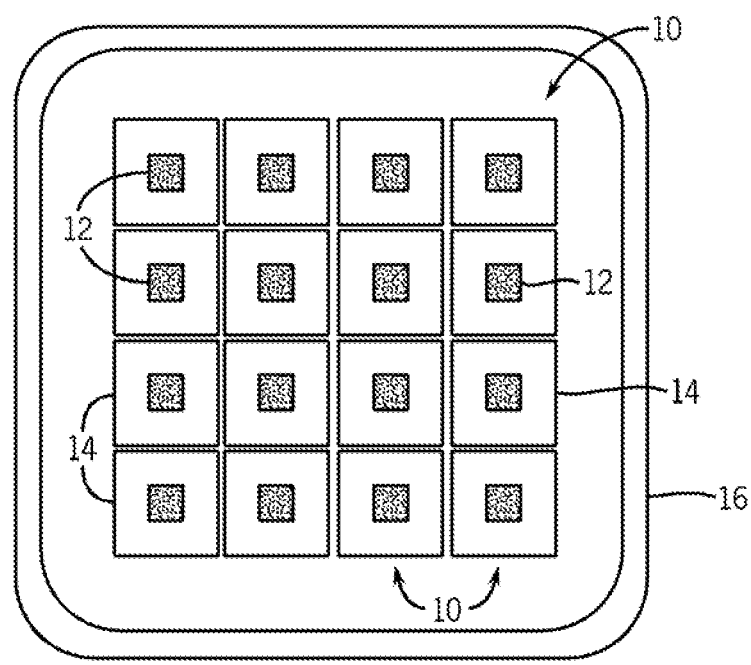
FIG. 1 is a top view of a plurality of buried die modules according to an embodiment of the invention.

Referring to FIG. 1, a plurality of manufactured buried die modules 10 or embedded chip packages are shown according to an exemplary embodiment of the invention. Each buried die module 10 includes one or more chips 12 (i.e., dies) connected with, and embedded in, a plurality of laminate flex layers 14 (i.e., redistribution layers). Each chip 12 is formed from a semiconducting material such as silicon or GaAs and is prepared such that an integrated circuit (IC) layout is formed on its surface. Each of the plurality of laminate layers 14 is in the form of a pre-formed laminate sheet or film that can be placed relative to the chip(s) 12. The laminate layers 14 can be formed of Kapton®, UItem®, polytetrafluoroethylene (PTFE), or another polymer film, such as a liquid crystal polymer (LCP) or a polyimide material. As shown in FIG. 1, each buried die module 10 is formed by dicing through laminate layers 14 in an area between adjacent buried die modules 10, with the buried die module build-up process being performed on a frame 16.

Referring to FIGS. 2-10, a technique for manufacturing each of a plurality of buried die modules 10 is set forth, according to an embodiment of the invention. A cross-section of a singular buried die module build-up process is shown in each of FIGS. 2-10 for ease of visualization of the build-up process.

According to an embodiment of the invention, the buried die module build-up process begins with the providing and patterning of an un-cut initial or "center" laminate flex layer 18. According to one embodiment, the initial laminate flex layer 18 is in the form of a Kapton® laminate flex, although as referenced above, other suitable materials may also be employed, such as UItem®, polytetrafluoroethylene (PTFE), or another polymer film, such as a liquid crystal polymer (LCP) or a polyimide material. The initial laminate flex layer 18 has a thickness of around 50 micrometers in order to accommodate positioning of an ultrathin die in an opening formed therein, as will be explained in detail below.

In patterning the initial laminate flex layer 18 in FIG. 2, a plurality of vias 20 is formed through the laminate layer. According to an exemplary embodiment, the vias 20 are formed by way of a laser ablation or laser drilling process. Alternatively, it is also recognized that vias 20 may be formed by way of other methods including: plasma etching, photo-definition, or mechanical drilling processes. Upon formation of the vias 20, a metal layer/material (e.g., a seed metal and/or copper) is then applied onto the laminate flex layer 18 by way of, for example, a sputtering, electroplating, and/or electroless application process, and is then formed into metal interconnects 22. According to one embodiment of the invention, the metal layer/material is patterned and etched such that metal interconnects 22 are formed that extend through vias 20 and form interconnects 22 on each of a first surface 24 of initial laminate flex layer 18 and a second surface 26 of initial laminate flex layer 18. According to another embodiment, it is recognized that the initial laminate flex layer 18 may be provided as a "pre-patterned" layer having the plurality of vias 20 and the plurality of metal interconnects 22 already formed thereon/therein.

In a next step of the buried die module build-up process, and as shown in FIG. 3, a die opening 28 is formed in the initial laminate flex layer 18. The die opening 28 is of a size and shape essentially matching that of a die (i.e., die 30 in FIG. 6) to be placed therein, with the opening 28 being slightly oversized to accommodate receiving of the die therein. As shown in FIG. 3, the resulting shape of the initial laminate flex layer 18 is that of a "window frame" construction. According to embodiments of the invention, the opening 28 may be formed by one of a laser cutting and a die punch operation.

Referring now to FIGS. 4-5, the buried die module build-up process continues with the providing of an uncut laminate flex layer 32 having an adhesive material/layer 34 coated or applied thereto on a side to be joined to initial laminate flex layer 18. The uncut laminate flex layer 32 is a blank or unpatterned laminate flex. The uncut laminate flex layer 32 is positioned on (i.e., laminated onto) the first surface 24 of initial laminate flex layer 18 and secured thereto by way of the adhesive 34, as shown in FIG. 5, with the uncut laminate flex layer 32 covering one side of the die opening 28 formed in initial laminate flex layer 18. According to one embodiment, the uncut laminate flex layer 32 is applied to the initial laminate flex layer 18 by way of a vacuum lamination, with the vacuum lamination being performed at a temperature that prevents curing of the adhesive material 34.

Upon placement of uncut laminate flex layer 32 onto initial laminate flex layer 18, a die 30 is positioned within die opening 28 formed in initial laminate flex layer 18, as shown in FIG. 6. The die 30 is secured within opening 28 by way of the adhesive material 34 applied to uncut laminate flex layer 32. According to an exemplary embodiment of the invention, and as shown in FIG. 6, the die 30 is in the form of an "ultrathin die" that has a thickness equal to or matching that of initial laminate flex layer 18. Thus, for example, each of the initial laminate flex layer 18 and the die 30 can be constructed to have a matching thickness of around 50 micrometers.

As shown in FIG. 6, upon placement of the die 30 into opening 28, an open/void moated region 36 remains present between die 30 and initial laminate flex layer 18. The vacuum lamination step that is performed to secure uncut laminate flex layer 32 to initial laminate flex layer 18 also acts to eliminate (at least partially) the void that is present in moated region 36. That is, in performing the vacuum lamination, adhesive material 34 is drawn into the moated region 36 to at least partially eliminate/fill the moated region.

Figure 7:
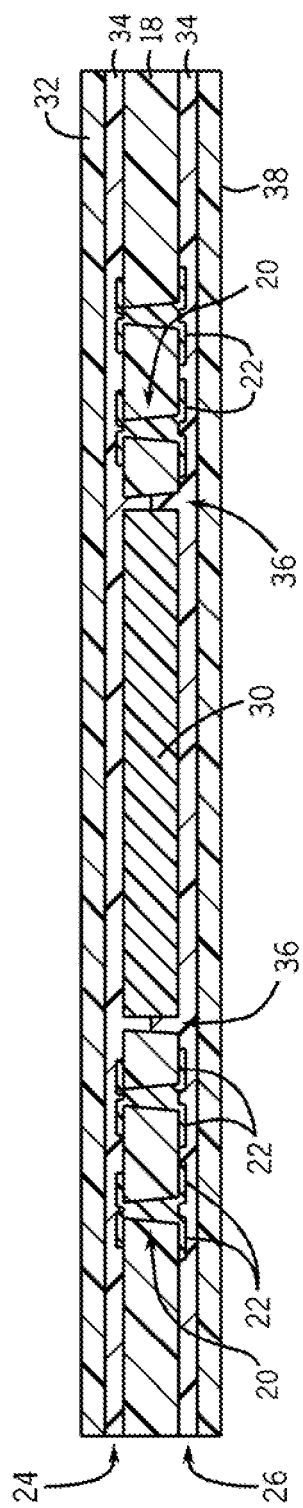

The buried die module build-up process continues with the providing of another uncut laminate flex layer 38 that is applied onto the second surface 26 of initial laminate flex layer 18 and onto the surface of the die 30 that is still exposed, as shown in FIG. 7. The uncut laminate flex layer 38 is a blank or unpatterned laminate flex and is positioned on (i.e., laminated onto) initial laminate flex layer 18 and is secured thereto by way of an adhesive material/layer 34. In placing the uncut laminate flex layer 38 onto initial laminate flex layer 18, a vacuum lamination (i.e., vacuum baking) step is performed to secure uncut laminate flex layer 38 to initial laminate flex layer 18. The vacuum lamination also functions to eliminate/fill (at least partially) the void that is present in moated region 36 between the die 30 and initial laminate flex layer 18, by drawing adhesive material 34 into the moated region 36 to at least partially eliminate the void therein and fill the moated region. As previously indicated, this vacuum lamination is performed at a temperature that prevents curing of the adhesive material 34.

Upon placement of die 30 within opening 28 in initial laminate flex layer 18 and lamination of uncut laminate flex layers 38, 38 to initial laminate flex layer 18 and die 30, a curing of the adhesive layers 34 is performed. According to one embodiment, the curing is accomplished by way of a pressure baking operation, although it is recognized that other suitable curing processes could be employed. Advantageously, according to embodiments of the invention, only a single baking/curing step is performed to cure both adhesive layers 34, therefore reducing processing time and costs associated with the build-up of the buried die module.

Figure 8:
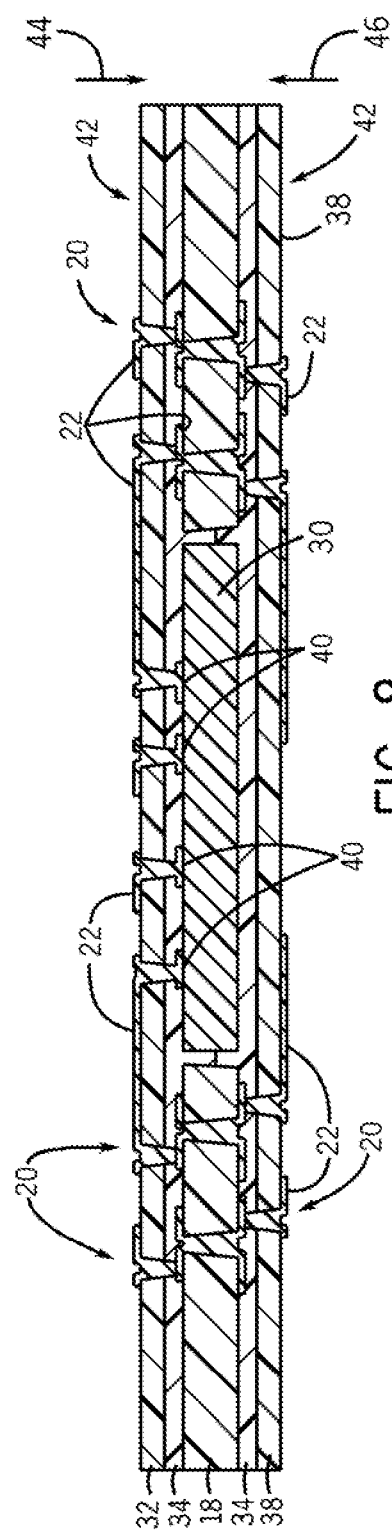

Referring now to FIG. 8, in a next step of the build-up technique, the uncut laminate flex layers 32, 38 are patterned to form a plurality of vias 20, with the vias being drilled through the laminate flex layers 32, 38. The vias 20 are formed at positions corresponding to metal interconnects 22 formed on initial re-distribution layer 18, so as to expose the metal interconnects 22. Additional vias 20 are drilled down to pads 40 on die 30, so as to expose these pads. According to an exemplary embodiment, the vias 20 are formed by way of a laser ablation or laser drilling process. Alternatively, it is also recognized that vias 20 may be formed by way of other methods including: plasma etching, photo-definition, or mechanical drilling processes. A metal layer/material (e.g., a seed metal and/or copper) is then applied onto the uncut laminate flex layers 32, 38 by way of, for example, a sputtering or electroplating process, and is then formed into metal interconnects 22. The metal layer/material is patterned and etched such that metal interconnects 22 are formed that extend from outward facing surfaces 42 of laminate flex layers 32, 38 and down through vias 20. The metal interconnects 22 on laminate flex layers 32, 38 thus form an electrical connection with interconnects 22 on initial laminate flex layer 18 and a direct metallic and electrical connection to die pads 40.

As shown in FIG. 8, for the uncut laminate flex layer 32 that is applied to the first surface 24 of initial laminate flex layer 18, the vias 20 are formed (i.e., drilled, laser ablated) from a first direction 44. That is, vias 20 in the uncut laminate flex layer 32 are formed from the top-down. Conversely, for the uncut laminate flex layer 38 applied to the second surface 26 of initial laminate flex layer 18, the vias 20 are drilled from a second direction 46 that is opposite of the first direction 44. That is, vias 20 in the uncut laminate flex layer 38 are drilled from the bottom-up.

Figure 9:
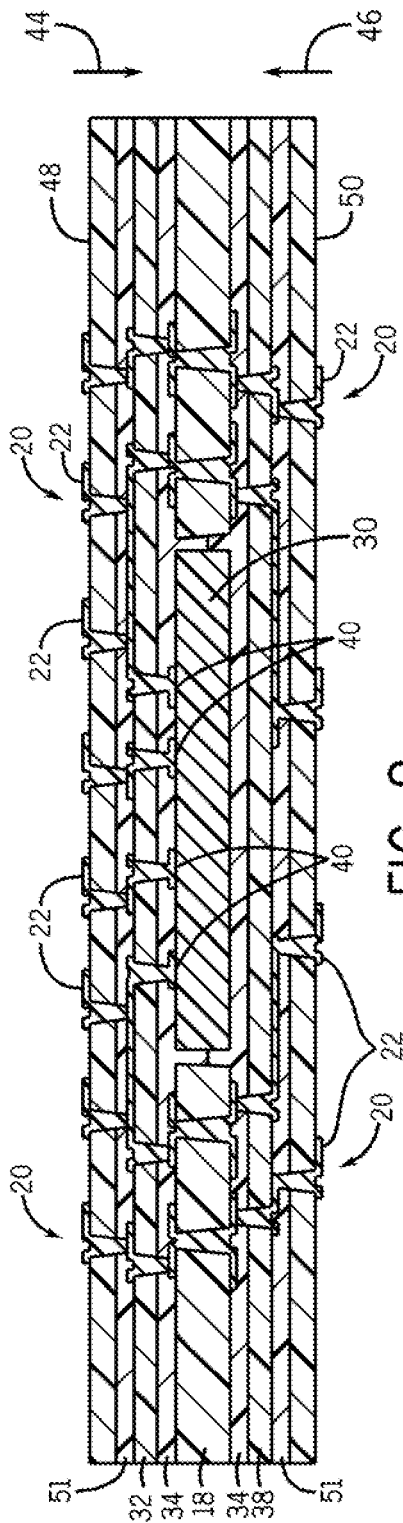

Referring now to FIG. 9, in a next step of the manufacturing technique, additional uncut laminate flex layers 48, 50 are laminated onto the uncut laminate flex layers 32, 38 and are subsequently patterned. The additional laminate flex layers 48, 50 are in the form of uncut laminate flex layers that are applied to opposing surfaces of the buried die module by way of an adhesive material 51, so as to form a balanced buried die module with equal numbers of laminate flex layers extending out from initial laminate flex layer 18. That is, the initial laminate flex layer 18 forms a "central" laminate flex layer, and the additional laminate flex layers 48, 50 are applied on opposing sides of the initial laminate flex layer 18 (i.e., on both the first and second surfaces 24, 26 of initial laminate flex layer 18). Such a double-sided lamination process serves to reduce stresses imparted to the initial laminate flex layer 18 and prevent warpage thereof.

As shown in FIG. 9, a plurality of vias 20 is formed in each of the additional laminate flex layers 48, 50. Metal interconnects 22 are also formed/patterned to extend down through vias 20 and through the additional laminate flex layer 48, 50, so as to electrically connect each of the additional laminate flex layers 48, 50 to the adjacent uncut laminate flex layers 32, 38. Similar to the patterning of laminate flex layers 32, 38, the patterning of additional laminate flex layers 48, 50 is performed according to a double-sided patterning process. That is, the vias 20 formed in laminate flex layer 48 are drilled/laser ablated from first direction 44 (i.e., from the top-down), while the vias 20 formed in laminate flex layer 50 are drilled/laser ablated from second direction 46 (i.e., from the bottom-up).

According to embodiments of the invention, it is recognized that still additional laminate flex layers beyond layers 48, 50 could be applied during a further build-up of the buried die module, with the number of additional laminate flex layers applied being dependent on design considerations of the buried die module.

Figure 10:
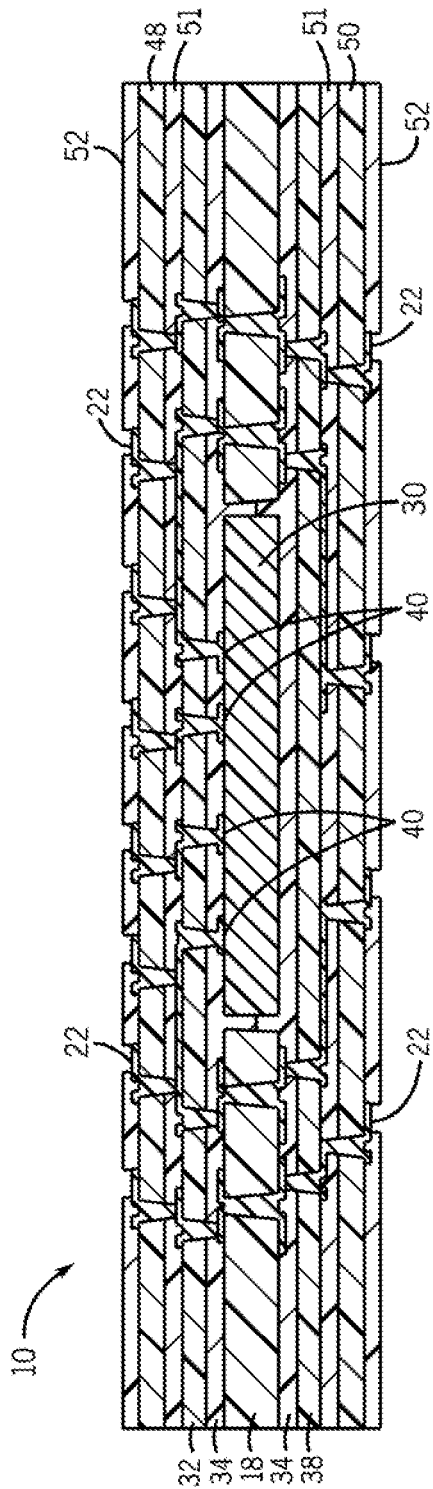
Figure 11:
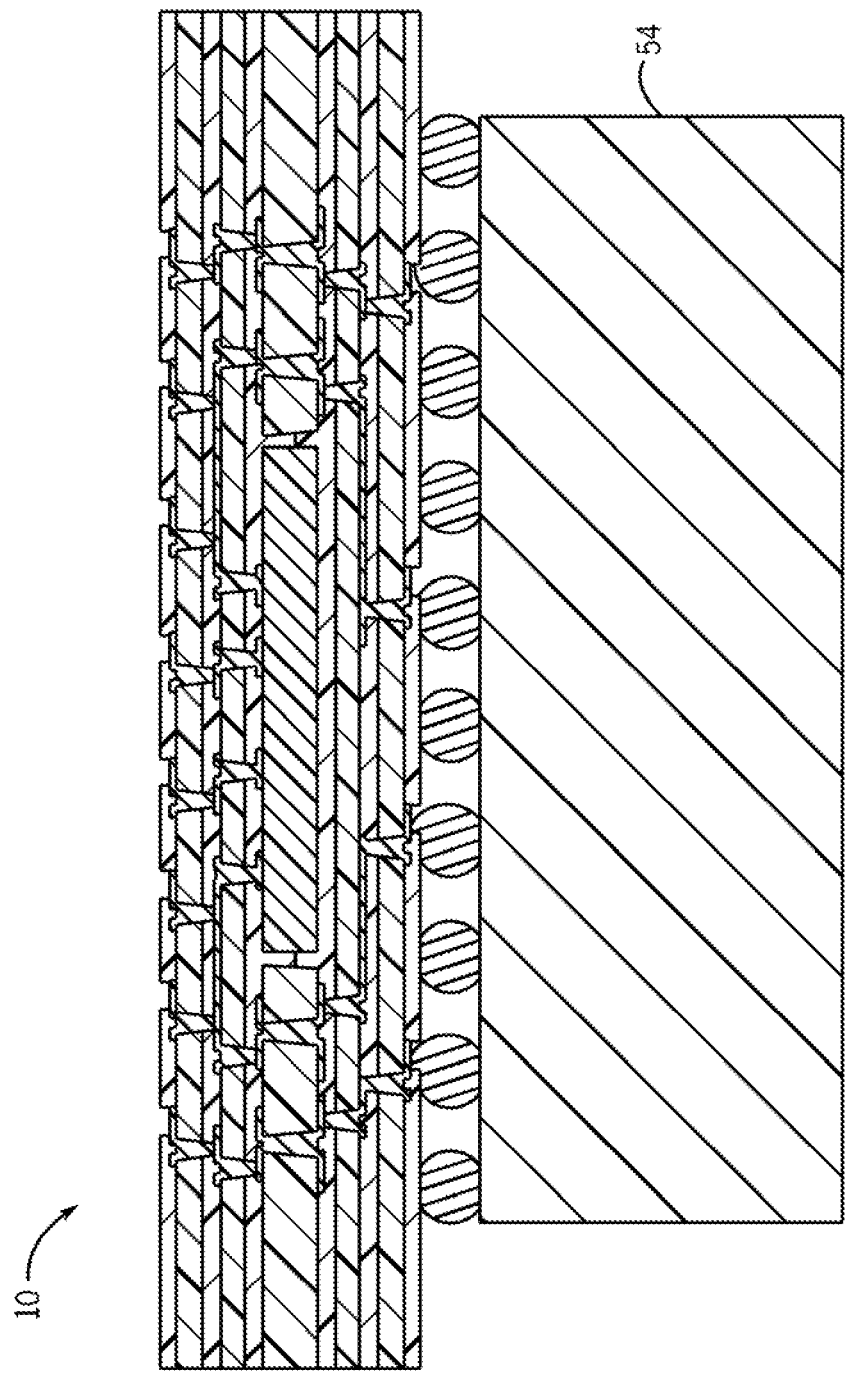
FIG. 11 is a schematic cross-sectional side view of a buried die module coupled to a ball grid array (BGA) package according to an embodiment of the invention.
Figure 12:
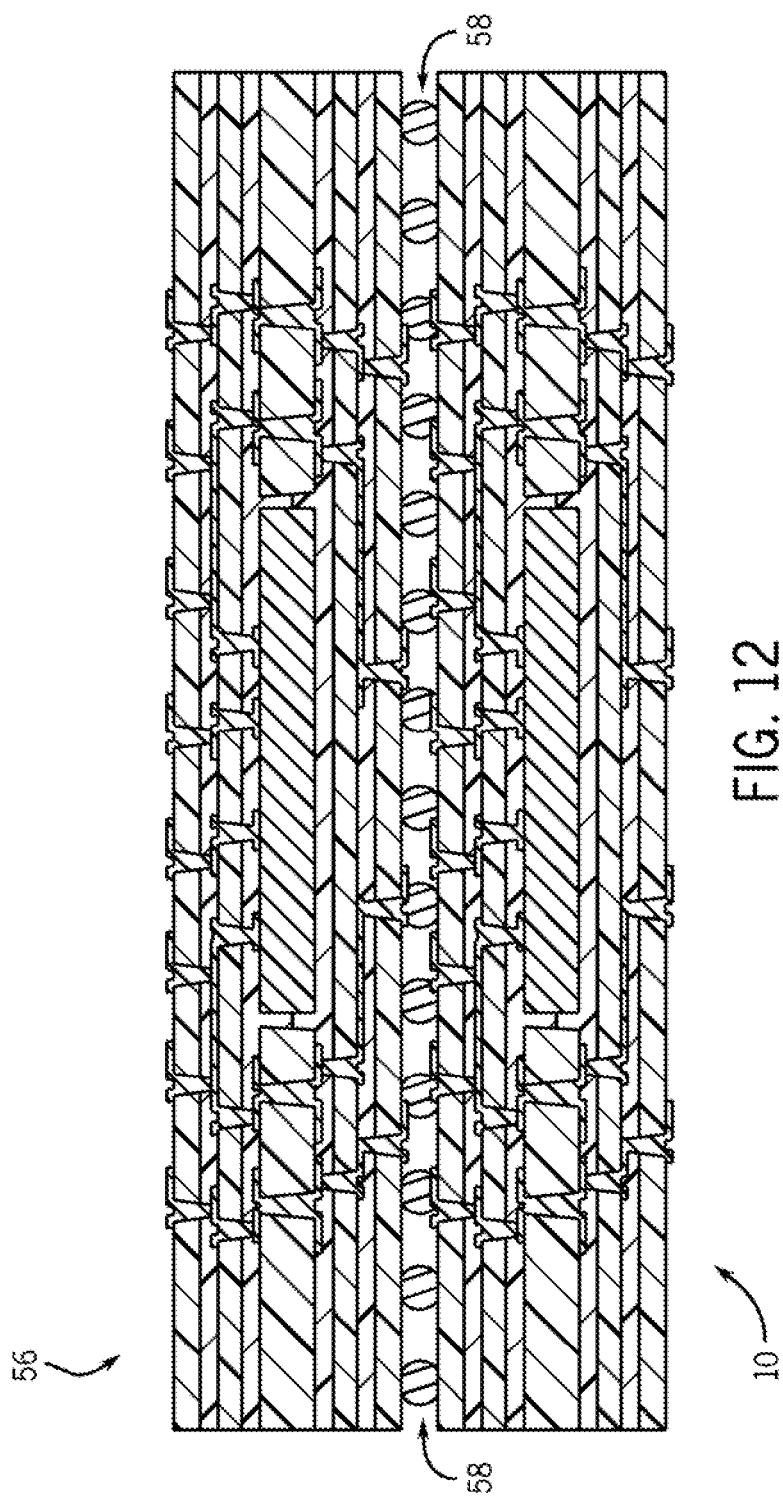
FIG. 12 is a schematic cross-sectional side view of a stacked arrangement of buried die modules according to an embodiment of the invention.

Referring now to FIG. 10, after application of all additional laminate flex layers 48, 50, a solder mask layer 52 is applied to outermost laminate flex layers 48, 50 on opposing surfaces of the buried die module. The solder mask 52 provides for connection of a separate package/module to the buried die module. For example, according to one embodiment, and as shown in FIG. 11, a ball grid array (BGA) package 54 is assembled to or stacked on the buried die module 10. According to another example, and as shown in FIG. 12, a separate buried die module 56 is stacked onto buried die module 10.

According to one embodiment, the stacked buried die modules 10, 56 are coupled together by way of a ball grid array 58, although it is recognized that a land grid array or conductive epoxy, for example, could also be used to couple the modules together. While FIG. 12 shows a stacking of two buried die modules 10, 56 in a vertical arrangement, it is recognized that a still greater number of buried die modules could be stacked on one another.

Figure 13:
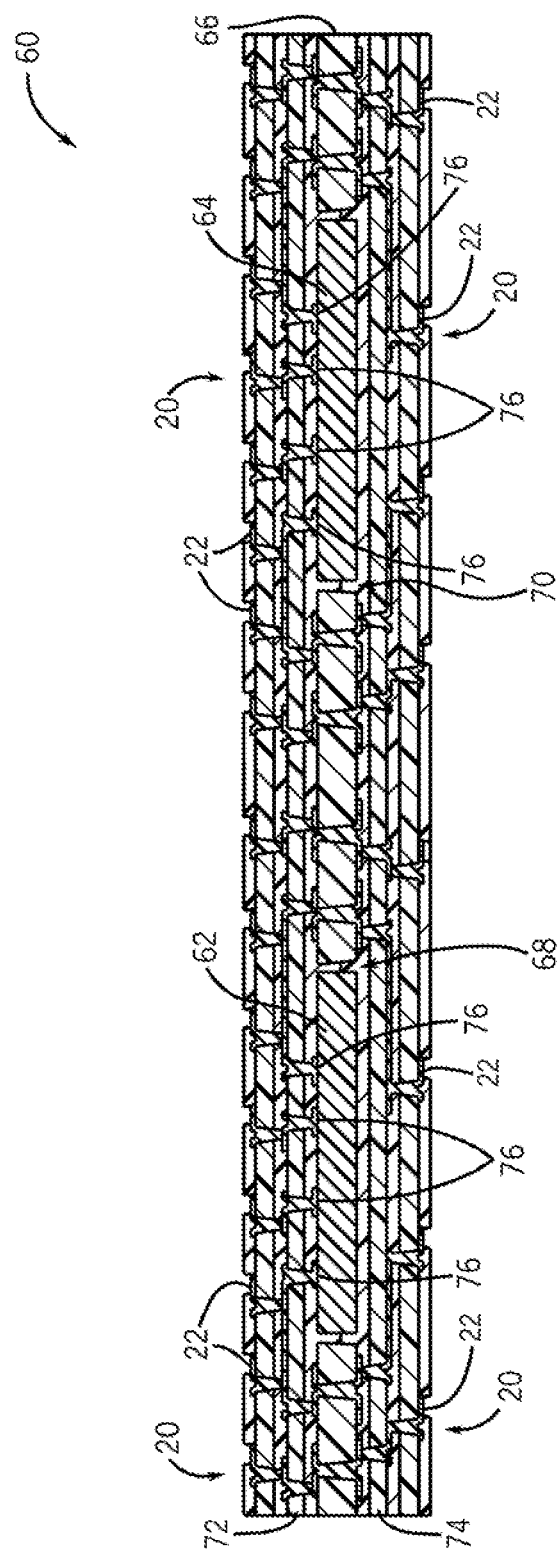
FIG. 13 is a schematic cross-sectional side view of a buried die module according to an embodiment of the invention.

Referring now to FIG. 13, according to another embodiment of the invention, a buried die module 60 is shown that includes a first die 62 and a second die 64 that are arranged/applied in a common horizontal plane. According to the embodiment of FIG. 13, each of the first and second dies 62, 64 has a thickness matching that of initial laminate flex layer 66. Each of the first and second dies 62, 64 are placed within separate die openings 68, 70 formed in initial laminate flex layer 66, so as to be arranged in the same horizontal plane. A plurality of vias 20 and metal interconnects 22 that extend down through vias 20 are patterned in adjacent uncut laminate flex layers 72, 74 such that metal interconnects extend to pads 76 on each of first and second dies 62, 64. That is, metal interconnects 22 extend down to pads 76 to form a direct metallic and electrical connection to die pads 76 of first and second dies 62, 64. The side-by-side embedding of first and second dies 62, 64 on the same plane (i.e. laminate flex layer 66), allows for a reduction in the number of laminate flex layers in the buried die module 60, thus helping to reduce overall thickness of the buried die module 60 and reduce associated production costs.

Beneficially, embodiments of the invention thus provide a buried die module build-up process having a shorter manufacturing cycle time and that allows for the application of multiple laminate layers while minimizing warpage of the module without the use of a stiffener. The build-up process combines the curing of multiple adhesive layers (via multiple curing steps) into a single curing step, so as to reduce processing time and costs associated therewith, and employs vacuum lamination steps for complete removal of all voids around the die, with the moated region around the die being completely filled. Additionally, the build-up process provides a module that is completely balanced, based on the double-sided lamination and via formation processes included therein and based on the use of an identical adhesive on both sides of the buried die. The finished buried die module resulting from the build-up process is very thin and is compatible with additional buried die modules, so as to provide for the formation of stacked die modules. Based on buried die module build-up techniques of the present invention, buried die modules can thus be constructed having a reduced thickness, controlled flatness, improved design density, increased resolution, and improved electrical performance over other existing buried die module build-up techniques.

Therefore, according to one embodiment of the invention, a method of forming a buried die module includes providing an initial laminate flex layer and forming a plurality of vias and a plurality of metal interconnects in and on the initial laminate flex layer, the plurality of metal interconnects extending through respective vias so as to form interconnects on each of opposing first and second surfaces of the initial laminate flex layer, forming a die opening through the initial laminate flex layer. The method also includes securing a first uncut laminate flex layer to the first surface of the initial laminate flex layer by way of an adhesive material, positioning a die within the die opening of the initial laminate flex layer and onto the adhesive material, securing a second uncut laminate flex layer to the second surface of the initial laminate flex layer by way of an adhesive material, curing the adhesive material between the first uncut laminate flex layer and the initial laminate flex layer and between the second uncut laminate flex layer and the initial laminate flex layer, and forming a plurality of vias and a plurality of metal interconnects in and on the first and second uncut laminate flex layers, each of the plurality of metal interconnects extending through a respective via and being directly metalized to one of a metal interconnect on the initial laminate flex layer and a die pad on the die.

According to another embodiment of the invention, a method of forming an embedded chip package includes forming a plurality of vias in a center laminate layer, forming a plurality of metal interconnects that extend through the plurality of vias so as to form interconnects on each of opposing first and second surfaces of the center laminate layer, forming a chip opening through the center laminate layer, applying a first uncut laminate layer to the first surface of the center laminate layer by way of an adhesive material, and positioning a chip within the chip opening of the center laminate layer and onto the adhesive material, the chip having a thickness equal to a thickness of the center laminate layer. The method also includes applying a second uncut laminate layer to the second surface of the center laminate layer by way of an adhesive material, curing the adhesive material between the first uncut laminate layer and the center laminate layer and between the second uncut laminate layer and the center laminate layer, and patterning the first and second uncut laminate layers to form a plurality of vias and a plurality of metal interconnects such that each of the plurality of metal interconnects extends through a respective via and is directly metalized to one of a metal interconnect on the center laminate layer and a chip pad on the chip.

According to yet another embodiment of the invention, an embedded chip package is manufactured by a process that includes the step of pre-patterning a center laminate layer to form a plurality of vias and a plurality of metal interconnects that extend through the plurality of vias, wherein the plurality of metal interconnects form interconnects on each of opposing first and second surfaces of the center laminate layer. The process also includes forming a die opening through the center laminate layer, applying a first uncut laminate layer to the first surface of the center laminate layer by way of an adhesive material, positioning a die within the die opening of the center laminate layer and onto the adhesive material, the die having a thickness equal to a thickness of the center laminate layer, applying a second uncut laminate layer to the second surface of the center laminate layer by way of an adhesive material, curing the adhesive material between the first uncut laminate flex layer and the base laminate flex layer and between the second uncut laminate flex layer and the base laminate flex layer together at the same time, and performing a double-sided patterning the first and second uncut laminate flex layers to form a plurality of vias and a plurality of metal interconnects, wherein the plurality of vias and the plurality of metal interconnects of the first uncut laminate flex layer are formed from a first direction and the plurality of vias and the plurality of metal interconnects of the second uncut laminate flex layer are formed from a second direction that is opposite the first direction.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:

1. A buried die module comprising:
   a center laminate flex layer having a plurality of vias and a plurality of metal interconnects extending through the plurality of vias so as to form interconnects on each of opposing first and second surfaces of the center laminate flex layer, the center laminate flex layer having a die opening formed therein;
   a die positioned in the die opening of the center laminate flex layer, the die having a plurality of die pads formed thereon;
   a plurality of additional laminate flex layers positioned on each of the first and second surfaces of the center laminate flex layer in a stacked arrangement, wherein each of the additional laminate flex layers comprises a plurality of vias and a plurality of metal interconnects extending through the plurality of vias to electrically connect a respective additional laminate flex layer to an adjacent laminate flex layer or to the die;
   wherein an equal number of additional laminate flex layers are positioned on each of the first and second surfaces of the center laminate flex layer so as to extend outwardly from the center laminate flex layer.

2. The buried die module of claim 1 wherein each of the plurality of additional laminate flex layers comprises an uncut laminate flex layer.

3. The buried die module of claim 1 further comprising an adhesive positioned between each pair of adjacent laminate flex layers to secure respective laminate flex layers together.

4. The buried die module of claim 1 wherein the additional laminate flex layers positioned on the first surface of the center laminate flex layer include vias and metal interconnects formed from a first direction and the additional laminate flex layers positioned on the second surface of the center laminate flex layer include vias and metal interconnects formed from a second direction that is opposite the first direction.

5. The buried die module of claim 1 wherein the die opening in the center laminate flex layer has an area larger than an area of the die, such that a moated region is present around the die when the die is positioned within the opening.

6. The buried die module of claim 5 further comprising an adhesive material positioned in the moated region so as to completely fill the moated region, such that no voids are present around the die.

7. The buried die module of claim 1 wherein the die has a thickness equal to a thickness of the center laminate flex layer.

8. The buried die module of claim 1 wherein the center laminate flex layer includes a second die opening formed therein.

9. The buried die module of claim 8 further comprising a second die positioned within the second die opening of the center laminate flex layer, such that the die and the second die are arranged in a common horizontal plane.

10. A buried die module comprising:
    a center laminate flex layer having a plurality of vias and a plurality of metal interconnects extending through the plurality of vias so as to form interconnects on each of opposing first and second surfaces of the center laminate flex layer, the center laminate flex layer having a die opening formed therein;
    a die positioned in the die opening of the center laminate flex layer, the die having a plurality of die pads formed thereon;
    a first plurality of laminate flex layers attached to the first surface of the center laminate flex layer, wherein each of the laminate flex layers in the first plurality of laminate flex layers comprises a plurality of vias and a plurality of metal interconnects configured to electrically connect a respective laminate flex layer to an adjacent laminate flex layer; and
    a second plurality of laminate flex layers attached to the second surface of the center laminate flex layer, wherein each of the laminate flex layers in the second plurality of laminate flex layers comprises a plurality of vias and a plurality of metal interconnects configured to electrically connect a respective laminate flex layer to an adjacent laminate flex layer;
    wherein the number of laminate flex layers in the first plurality of laminate flex layers is equal to the number of laminate flex layers in the second plurality of laminate flex layers so as to form a balanced buried die module with an equal number of laminate flex layers positioned on each of opposing sides of the center laminate flex layer.

11. The buried die module of claim 10 wherein each of the first and second plurality of laminate flex layers comprises an uncut laminate flex layer.

12. The buried die module of claim 10 further comprising an adhesive positioned between each pair of adjacent laminate flex layers to secure respective laminate flex layers together.

13. The buried die module of claim 10 wherein the first plurality of laminate flex layers include vias and metal interconnects formed from a first direction and the second plurality of laminate flex layers include vias and metal interconnects formed from a second direction that is opposite the first direction.

14. The buried die module of claim 10 wherein the die opening in the center laminate flex layer has an area larger than an area of the die, such that a moated region is present around the die when the die is positioned within the opening.

15. The buried die module of claim 14 further comprising an adhesive material positioned in the moated region so as to completely fill the moated region, such that no voids are present around the die.

16. The buried die module of claim 10 wherein the die has a thickness equal to a thickness of the center laminate flex layer.

17. The buried die module of claim 10 wherein the center laminate flex layer includes a second die opening formed therein.

18. The buried die module of claim 17 further comprising a second die positioned within the second die opening of the center laminate flex layer, such that the die and the second die are arranged in a common horizontal plane.

19. A buried die module comprising:
    a center laminate flex layer having a plurality of vias and a plurality of metal interconnects extending through the plurality of vias so as to form interconnects on each of opposing first and second surfaces of the center laminate flex layer, the center laminate flex layer having a die opening formed therein;
    a die positioned in the die opening of the center laminate flex layer, the die having a plurality of die pads formed thereon;
    a plurality of additional laminate flex layers positioned on the first and second surfaces of the center laminate flex layer in a stacked arrangement, wherein each of the additional laminate flex layers comprises a plurality of vias and a plurality of metal interconnects extending through the plurality of vias to electrically connect a respective additional laminate flex layer to an adjacent laminate flex layer or to the die;

wherein the plurality of additional laminate flex layers consists of an equal number of additional laminate flex layers positioned on each of the first and second surfaces of the center laminate flex layer, such that a balanced buried die module is formed.

\* \* \* \* \*